United States Patent
Cuchiaro et al.

(10) Patent No.: US 6,207,465 B1
(45) Date of Patent: Mar. 27, 2001

(54) METHOD OF FABRICATING FERROELECTRIC INTEGRATED CIRCUIT USING DRY AND WET ETCHING

(75) Inventors: Joseph D. Cuchiaro, Colorado Springs, CO (US); Akira Furuya, Tokyo (JP); Carlos A. Paz de Araujo, Colorado Springs, CO (US); Yoichi Miyasaka, Tokyo (JP)

(73) Assignees: Symetrix Corporation, Colorado Springs, CO (US); NEC Corporation (JP)

( * ) Notice: Subject to any disclaimer, the term of this patent is extended or adjusted under 35 U.S.C. 154(b) by 0 days.

(21) Appl. No.: 09/062,248

(22) Filed: Apr. 17, 1998

(51) Int. Cl.[7] .................................................. H01L 21/00
(52) U.S. Cl. ............................................. 438/3; 438/240
(58) Field of Search ..................... 438/444, 627, 438/690, 704, 724, 734, 757, 785, 117, 125, 232, 3, 240

(56) References Cited

U.S. PATENT DOCUMENTS

| | | | |
|---|---|---|---|
| 4,822,753 | * | 4/1989 | Pintchovski et al. ................. 438/643 |
| 5,021,353 | * | 6/1991 | Lowrey et al. ...................... 438/377 |
| 5,064,774 | * | 11/1991 | Pfiester ............................. 438/231 |
| 5,334,867 | * | 8/1994 | Shin et al. ......................... 257/222 |
| 5,396,095 | * | 3/1995 | Wolters et al. ..................... 257/310 |
| 5,434,102 | | 7/1995 | Watanabe et al. ................... 437/130 |
| 5,438,023 | * | 8/1995 | Argos, Jr. et al. ..................... 438/3 |
| 5,439,845 | | 8/1995 | Watanabe et al. ................... 437/130 |
| 5,481,490 | | 1/1996 | Watanabe et al. ................... 365/145 |
| 5,508,226 | | 4/1996 | Ito et al. ............................ 437/130 |
| 5,523,595 | | 6/1996 | Takenaka et al. ................... 257/295 |
| 5,784,310 | | 7/1998 | Cuchiaro et al. ................... 365/145 |

FOREIGN PATENT DOCUMENTS 2-232974 * 9/1990 (JP).
4-371568 * 12/1992 (JP).

OTHER PUBLICATIONS

Wolf et al., Silicon Processing for the VLSI Era: vol. 1, 1986, TK 7874 .W6 v. 1c.123, pp. 540–541.*
Article: H. Achard and H. Mace; "Integration of Ferroelectric Thin Films For Memory Applications"; Science and Technology of Electroceramic Thin Films; Kluwer Academic Publishers, 1995; pp. 353–372, inclusive.
Symposium Abstract: Ilsub Chung, et al.; "Integration of Ferroelectric Capacitors Using Multilayered Electrode"; The Tenth International Symposium on the Applications of Ferroelectrics, Aug. 18–21, 1996, Hilton Hotel, East Brunswick, NJ, Rutgers University; p. 55.
Symposium Abstract: Takashi Hase, et al.; "Analysis of the Degradation of PZT and $SrBi_2Ta_2O_9$ Thin Films With A Reductive Process"; The Eighth International Symposium on Integrated Ferroelectrics, Mar. 18–20, 1996, Tempe, AZ; Plenary Talks, Invited Lectures and Contributed Papers.

* cited by examiner

Primary Examiner—Carl Whitehead, Jr.
Assistant Examiner—Jeff Vockrodt
(74) Attorney, Agent, or Firm—Duft, Graziano & Forest, P.C.

(57) ABSTRACT

In a ferroelectric integrated circuit, a hydrogen barrier layer comprising titanium or titanium nitride or both is formed over a metal oxide element to protect it from hydrogen degradation. After hydrogen annealing and other process steps causing hydrogenating or reducing conditions, the hydrogen barrier layer is removed in a two-step etching process. The first etch step is a dry etch, preferably a standard ion-mill etching process, which rapidly removes most of the hydrogen barrier layer. The second step is a wet, chemical etch, preferably using a solution containing $NH_4OH$, $H_2O_2$, and $H_2O$, which selectively removes remnants of the hydrogen barrier layer from the circuit by oxidizing a chemical element of the barrier layer. The metal oxide material preferably comprises a layered superlattice compound.

24 Claims, 6 Drawing Sheets

METHOD OF FABRICATING
FERROELECTRIC INTEGRATED CIRCUIT
USING DRY AND WET ETCHING

BACKGROUND OF THE INVENTION

1. Field of the Invention

The invention relates to a method for fabricating ferroelectric integrated circuits that effectively removes hydrogen barrier layers from ferroelectric devices.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$ type ferroelectric oxides such as PZT (lead titanate zirconate) and PLZT (lanthanum lead titanate zirconate) have been studied for practical use in integrated circuits. Layered superlattice material oxides have also been studied for use in integrated circuits. See Watanabe, U.S. Pat. No. 5,434,102. Layered superlattice compounds exhibit characteristics in ferroelectric memories that are orders of magnitude superior to those of PZT and PLZT compounds. While prototypes of ferroelectric memories have been made successfully with the layered superlattice compounds, there is as yet no manufacturing process for making memories using either the $ABO_3$ type oxides or the layered superlattice material compounds with the desired electronic characteristics economically and in commercial quantities. One reason, among others, for the lack of economical commercial processes for the fabrication of high quality ferroelectric integrated circuits is that the oxide compounds are susceptible to reduction by hydrogen during hydrogen annealing. Hydrogen annealing is a common step during CMOS integrated circuit memory fabrication and results in degradation of some important ferroelectric properties. This is especially true for the layered superlattice compounds, which are complex, layered oxides that are especially prone to degradation by hydrogen.

A typical ferroelectric memory device in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a ferroelectric thin film located between a first or bottom electrode and a second or top electrode, the electrodes typically containing platinum. During manufacture of the circuit, the MOSFET is subjected to conditions causing defects in the silicon substrate. For example, the manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a hydrogen annealing step, in which defects such as dangling bonds are eliminated by utilizing the reducing property of hydrogen. Various techniques have been developed to effect the hydrogen annealing, such as $H_2$-gas heat treatment in ambient conditions. Conventionally, hydrogen treatments are conducted between 350° and 550° C., typically around 450° C. for a time period of about 60 minutes. In addition, there are several other integrated circuit fabrication processes that expose the integrated circuit to hydrogen, often at elevated temperatures, such as CVD processes for depositing metals, and growth of silicon dioxide from silane. During processes that involve hydrogen, the hydrogen diffuses through the top electrode and the side of the capacitor to the ferroelectric thin film and reduces the oxides contained in the ferroelectric material. The absorbed hydrogen also metallizes the surface of the ferroelectric thin film. The adhesivity of the ferroelectric thin film to the upper electrode is lowered by the chemical change taking place at the interface. Alternatively, the upper electrode is pushed up by the oxygen gas, water, and other products of the oxidation-reduction reactions taking place. As a result of these effects, the electronic properties of the capacitor are degraded, and peeling is likely to take place at the interface between the top electrode and the ferroelectric thin film. These problems are acute in ferroelectric memories containing layered superlattice compounds because these oxide compounds are particularly complex and prone to degradation by hydrogen-reduction.

Prior art teaches the use of hydrogen barrier layers to protect the ferroelectric capacitor from the deleterious effects of hydrogen. Depending on the uses and manufacturing conditions of the integrated circuit, it is sometimes desirable or necessary to remove the hydrogen barrier after the hydrogen annealing step. Some barrier materials, such as silicon nitride are virtually nonconductive, and their presence can interfere with electrical contacts to the capacitor and other circuit elements. Titanium nitride, on the other hand, is relatively conductive, but it is less conductive than typical wiring and electrode materials. Also, titanium nitride and other barrier materials typically are partially oxidized by oxygen contaminants during deposition or by other oxidizing conditions. The oxides in the barrier layer act to diminish the electrical conductivity. Furthermore, if the hydrogen barrier layer is conductive, it is desirable to remove it completely from the vicinity of the ferroelectric thin film to avoid electrical shorting within the capacitor. For these reasons it is often desirable to remove titanium nitride from ferroelectric devices after hydrogen annealing.

Two general etching techniques are used conventionally to remove such material from integrated circuits: dry, ion-mill etching and wet, chemical etching.

Etching in baths of wet chemicals has several desirable characteristics. It is relatively simple. It typically has high selectivity, often in excess of 10:1, with respect to both other layers and to photoresist. On the other hand, except in special cases where certain crystal lattice planes are attacked preferentially, wet etching is slow. Furthermore, it is isotropic, that is, it attacks equally in all directions. The etching chemicals begin to attack the side walls as soon as some vertical etching has taken place. This results in a loss of material beneath the mask. The undercut roughly equals the thickness of the film being etched. This can be an acceptable disadvantage if the minimum feature sizes in the circuit are an order of magnitude greater than the thickness of the thin film etched. But, as integrated circuits become more dense, the width of the circuit devices approaches film thickness. Furthermore, even when the device is relatively wide compared to film thickness, undercutting can lead to circuit shorting and other problems. Therefore, isotropic etching is often not suitable in a fabrication process.

The other category, the dry etching techniques, includes ion-mill etching, and ionized gas and ionized plasma methods. In ion milling methods, inert gases such as neon or argon are employed. A flux of ions is accelerated toward the surface to be etched, and the collisions at the surface result in its etching. Ion-mill etching is physical, not chemical, so it cannot take advantage of differences in chemical composition to etch some chemical compounds selectively over others. Also, it does not remove all traces of material. For RIE methods, reactive gases are used. Although gases are good insulators, it is possible to ionize a portion of the atoms or molecules by the application of sufficient direct current (DC) or radio frequency (RF) voltage, especially at reduced pressures. In standard reactive ion etching (RIE), reactive gases (such as $Cl_2$ and $CCl_3F$) are used. The reactive gas plays a dual role; it both sputter-etches and reacts with the material, producing a reaction product that is volatile so that it can be pumped out. Because the etching medium is a flux of ions directed towards the substrate, etching is anisotropic, that is, preferential in the direction normal to the surface. RIE is efficient because it is rapid and anisotropic. But, RIE also does not remove all traces of material.

3. Solution to the Problem

The invention solves the above problems by providing a method for fabricating ferroelectric elements in integrated circuits that removes a hydrogen barrier efficiently and completely.

The invention provides a method of providing a substrate, forming a thin film of metal oxide material on the substrate, forming a hydrogen barrier layer directly over at least a portion of the thin film of metal oxide material, then performing a dry etch to remove a significant portion of said hydrogen barrier layer; and then performing a wet, chemical etch to remove remnants of the hydrogen barrier layer. Preferably the dry etch is an ion-mill etching process. Preferably the wet etch comprises using a solution containing $NH_4OH$, $H_2O_2$, and $H_2O$. Preferably the hydrogen barrier layer comprises a nitride of titanium. In another application, the hydrogen barrier layer comprises titanium. In another application, the hydrogen barrier layer comprises a nitride of silicon.

In an application of the invention, the metal oxide material comprises an oxide compound containing at least two metals. Preferably at least one of the metals is present in an excess amount.

Preferably the thin film of metal oxide material comprises a layered superlattice compound. Preferably the layered superlattice compound comprises strontium, bismuth, and at least one of the metals from the group consisting of tantalum and niobium. Preferably the layered superlattice compound contains an excess amount of at least one of the metals selected from the group consisting of bismuth and niobium.

An application of the invention is use of the metal oxide material as part of a ferroelectric capacitor or part of a FET.

An embodiment of the invention further provides for forming a bottom electrode over which the thin film of metal oxide material is formed; and forming a top electrode above the thin film of metal oxide material prior to forming the hydrogen barrier layer. The method can further include the step of etching at least a portion of said hydrogen barrier layer to expose a portion of said top electrode.

In another embodiment of the invention, the hydrogen barrier layer comprises at least two chemical elements, and a chemical reaction is performed with at least one of said chemical elements. Preferably two of the chemical elements are titanium and nitrogen. In another embodiment, two of the chemical elements are silicon and nitrogen. Preferably the chemical reaction is an oxidation reaction. Preferably the oxidation reaction is performed using hydrogen peroxide.

An embodiment of the invention is a method in which hydrogen barrier layer is formed comprising at least one free chemical element, and a chemical reaction is performed with at least one free chemical element. Preferably a free chemical element is titanium. In another embodiment, a free chemical element is silicon. Preferably the chemical reaction with the free element is an oxidation reaction. Preferably the oxidation reaction is performed using hydrogen peroxide.

Another aspect of the invention is removing a hydrogen barrier layer by using the combination of a dry etch step followed by a wet, chemical etching step that is selective to the barrier layer without significantly affecting the ferroelectric.

A key aspect of the invention is the use of an etch that is selective to free metal, such as titanium, rather than the barrier layer compound itself, e.g. titanium nitride. It has been found that there is always some free titanium in titanium nitride. This titanium is oxidized by $H_2O_2$ in $H_2O$, and the oxidized titanium weakens the titanium nitride structure so that it washes away easily.

Another aspect of the invention is that $H_2O_2$ oxidizes free titanium and has excellent selectivity between titanium and layered superlattice compounds.

DETAILED DESCRIPTION OF THE PREFERRED EMBODIMENT

1. Overview

Figure 2:
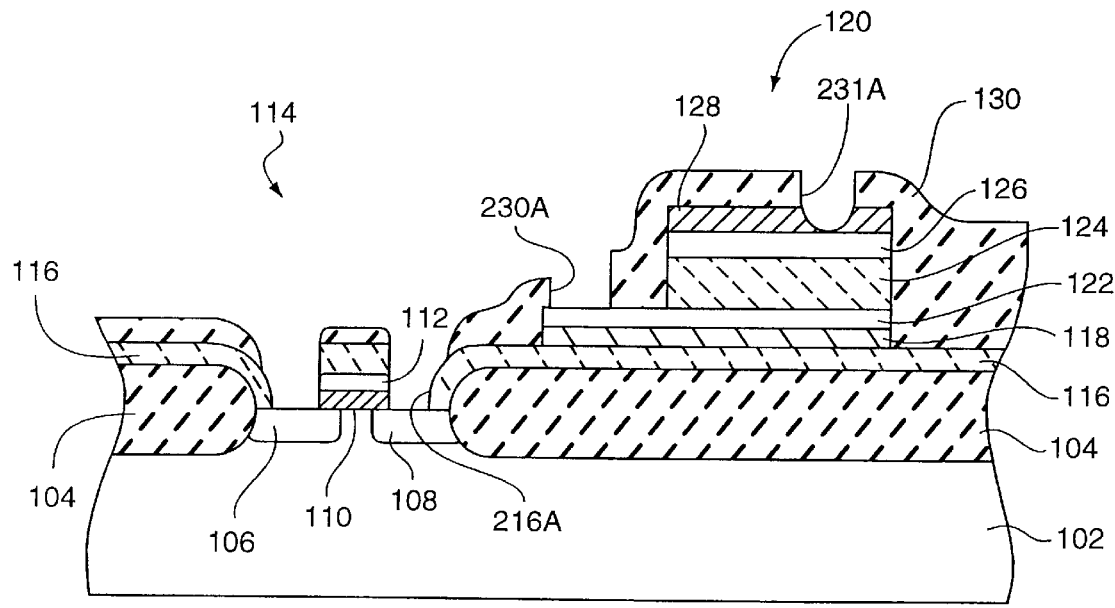
FIG. 2 is a cross-sectional view of a further intermediate stage in the fabrication of the integrated circuit depicted in FIG. 1 in which a dry-etch process step has etched a wiring hole through the titanium nitride hydrogen barrier layer down to the upper surface of the top electrode of the capacitor, leaving some remnants of barrier layer in the hole.
Figure 3:
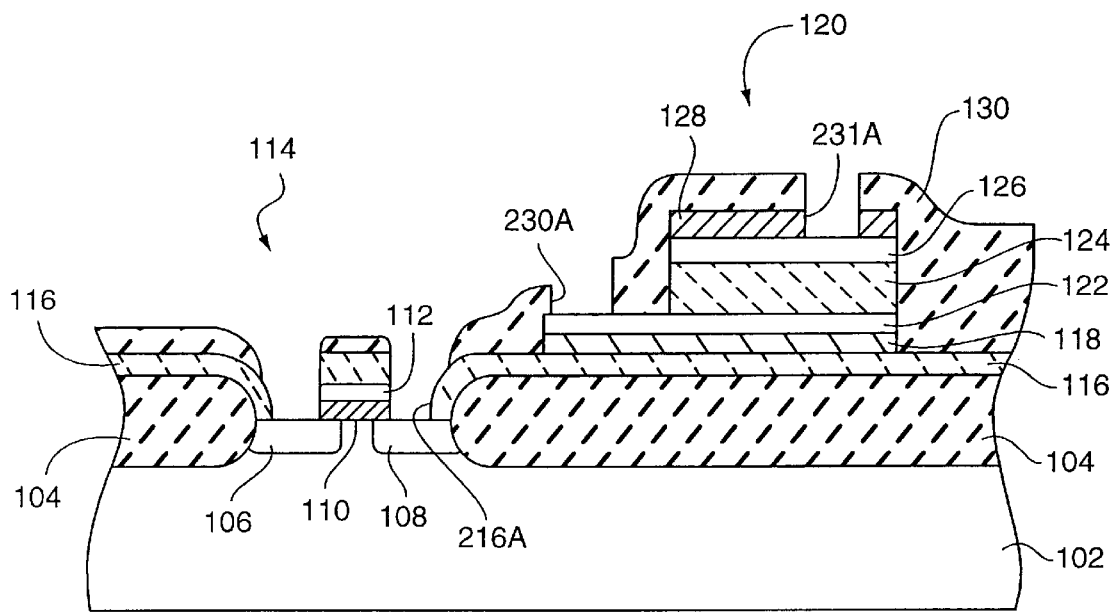
FIG. 3 is a cross-sectional view of a further intermediate stage in the fabrication of the integrated circuit depicted in FIGS. 1–2 in which a wet-etch process step has removed the remnants of the barrier layer from the upper surface of the top electrode of the capacitor.
Figure 4:
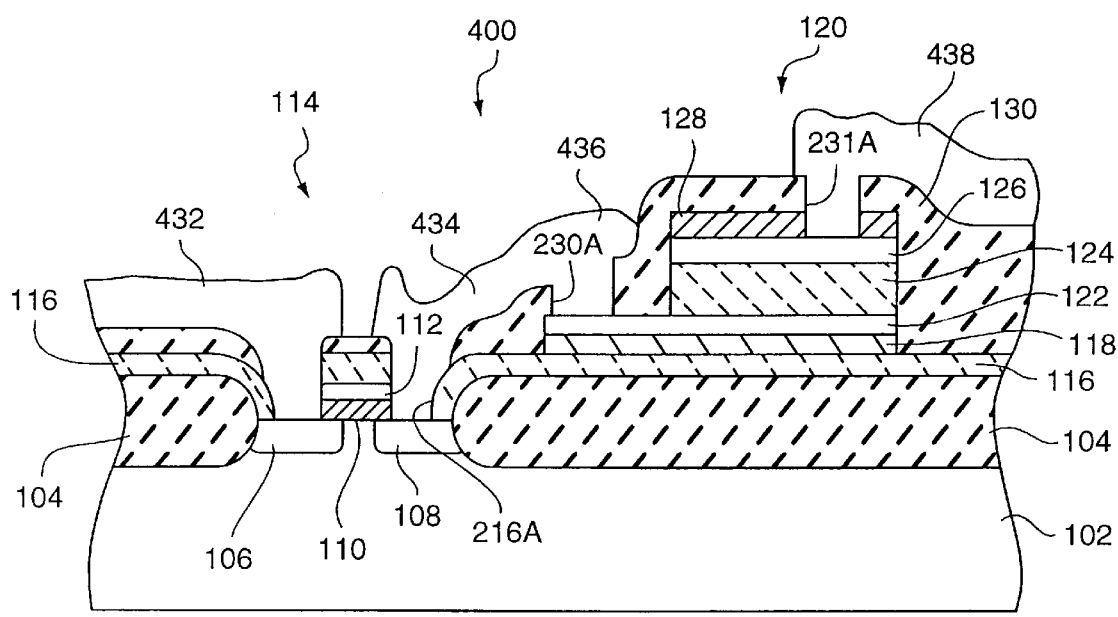
FIG. 4 is a cross-sectional view of a further stage in the fabrication of the integrated circuit depicted in FIGS. 1–3 in which a wiring layer has filled the wiring hole leading to the top electrode.
Figure 8:
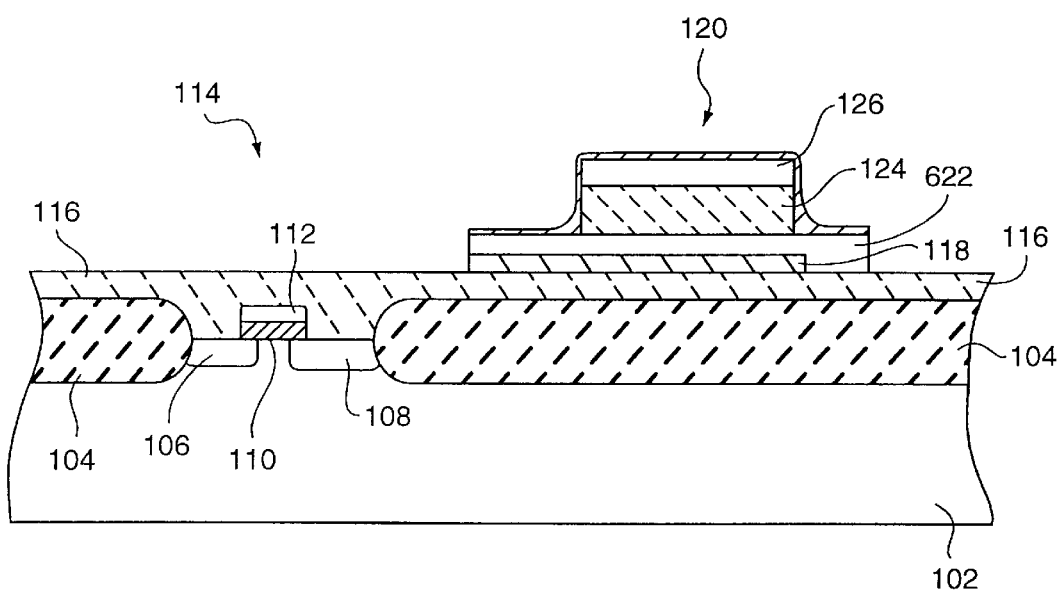
FIG. 8 is a cross-sectional view of a further intermediate stage in the fabrication of the integrated circuit depicted in FIGS. 6–7 in which a standard reactive ion-etching step has removed a major portion of the hydrogen barrier layer from all surfaces of the capacitor.
Figure 9:
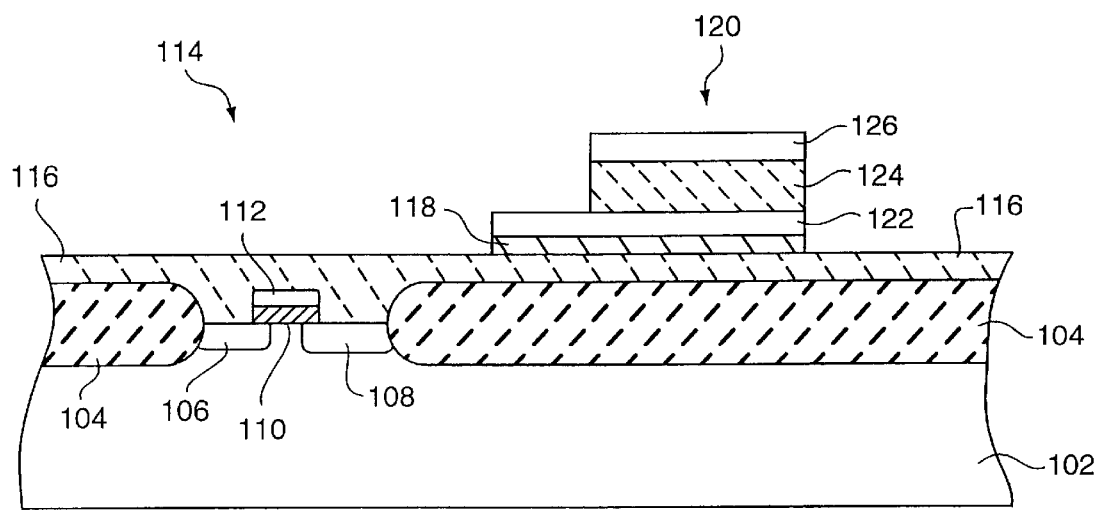
FIG. 9 is a cross-sectional view of a further intermediate stage in the fabrication of the integrated circuit depicted in FIGS. 6–8 in which a wet-etch processing step has selectively removed the remnants of the hydrogen barrier layer from the surfaces of the capacitor, which was then patterned.
Figure 10:
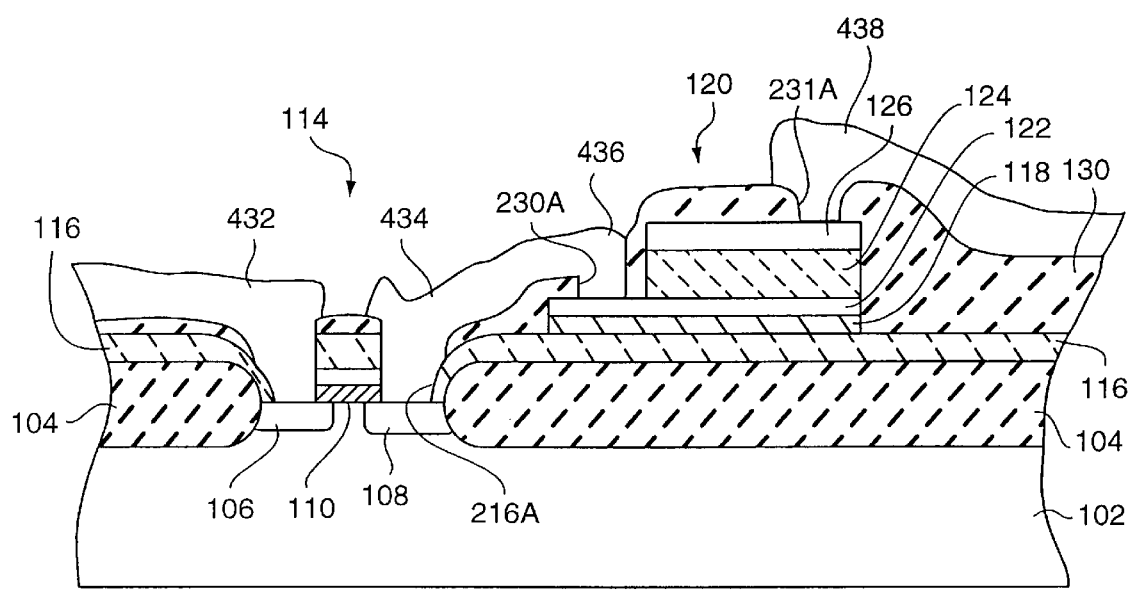
FIG. 10 is a cross-sectional view of a further stage in the fabrication of the integrated circuit depicted in FIGS. 6–9 in which an ILD layer has been deposited, wiring holes have been etched, and wiring layers deposited.

It should be understood that the FIGS. 1–10 depicting ferroelectric capacitors and integrated circuit devices are not meant to be actual plan or cross-sectional views of any particular portion of an actual integrated circuit device. In the actual devices the layers will not be as regular and the thicknesses may have different proportions. The various layers in actual devices often are curved and possess overlapping edges. The figures instead show idealized representations which are employed to depict more clearly and fully the structure and process of the invention than would otherwise be possible. Also, the figures represent only one of innumerable variations of ferroelectric devices that could be fabricated using the method of the invention. FIGS. 4 and 10 depict a portion of a ferroelectric memory containing a switch in the form of a field effect transistor in electrical connection with a ferroelectric capacitor. But, it would also be conceivable to use the method of this invention to fabricate a ferroelectric FET memory in which the ferroelectric element is incorporated in the switch element. Such a ferroelectric FET is described in McMillan, U.S. Pat. No. 5,523,964. Likewise, other integrated circuits fabricated using the method of the invention could include other elements and compositions of material.

Directing attention to FIGS. 1–4, there are shown cross-sectional views of intermediate stages of an exemplary nonvolatile ferroelectric memory cell that fabricated according to the method of the invention. The general manufacturing steps for fabricating integrated circuits containing MOSFETs and ferroelectric capacitor elements are described in Mihara, U.S. Pat. No. 5,466,629 and Yoshimori, U.S. Pat. No. 5,468,684, which are hereby incorporated by reference as if fully disclosed herein. General fabrication methods have been described in other references also. Therefore, the conventional elements of the circuit of FIGS. 1–4 will be simply identified here.

Figure 1:
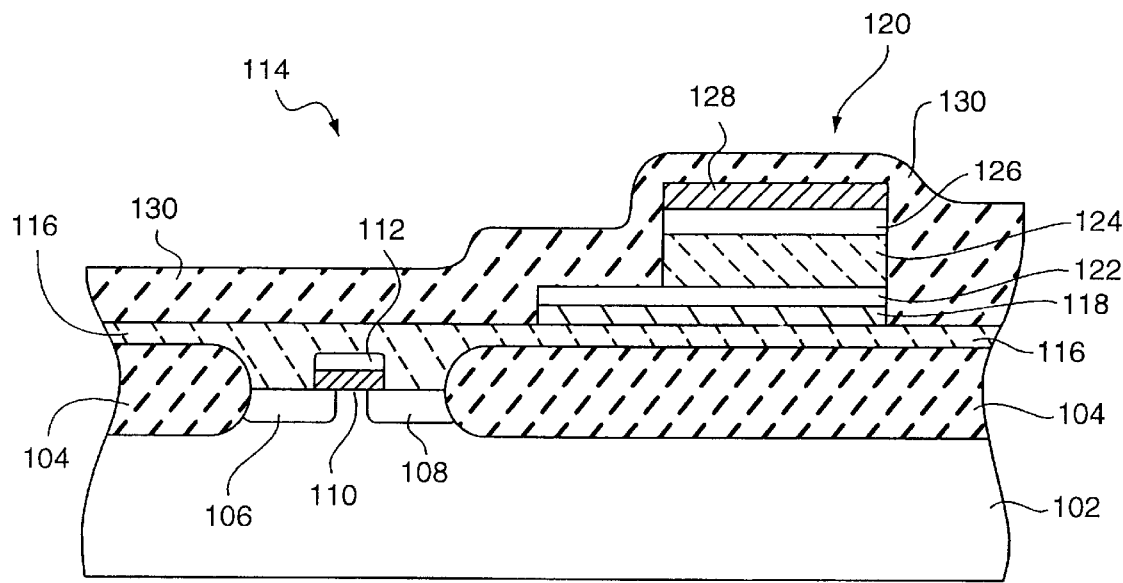
FIG. 1 is a cross-sectional view of an intermediate stage in the fabrication of an integrated circuit as may be performed by the method of the invention showing a nonvolatile ferroelectric memory cell in which a self-aligned hydrogen barrier layer is directly over a ferroelectric capacitor.

In FIG. 1, a field oxide region 104 is formed on a surface of a silicon substrate 102. A source region 106 and a drain region 108 are formed separately from each other within silicon substrate 102. A gate insulating layer 110 is formed on the silicon substrate 102 between the source and drain regions 106 and 108. Further, a gate electrode 112 is formed on the gate insulating layer 110. These source region 106, drain region 108, gate insulating layer 110 and gate electrode 112 together form a MOSFET 114.

An interlayer dielectric layer (ILD) 116 made of BPSG (boron-doped phosphosilicate glass) is formed on substrate 102 and field oxide region 104. An adhesive layer 118 is formed on a portion of ILD 116, and then a ferroelectric thin film capacitor 120 is formed on adhesive layer 118. The adhesive layer 118 is made of, for example, titanium, and typically has a thickness of 200 Å. Ferroelectric capacitor 120 is preferably formed on a conventional wafer that may be silicon, gallium arsenide or other semiconductor, or an insulator, such as glass or magnesium oxide (MgO). Adhesive layers, such as titanium, enhance the adhesion of the electrodes to adjacent underlying or overlying layers of the circuits.

Figure 5:
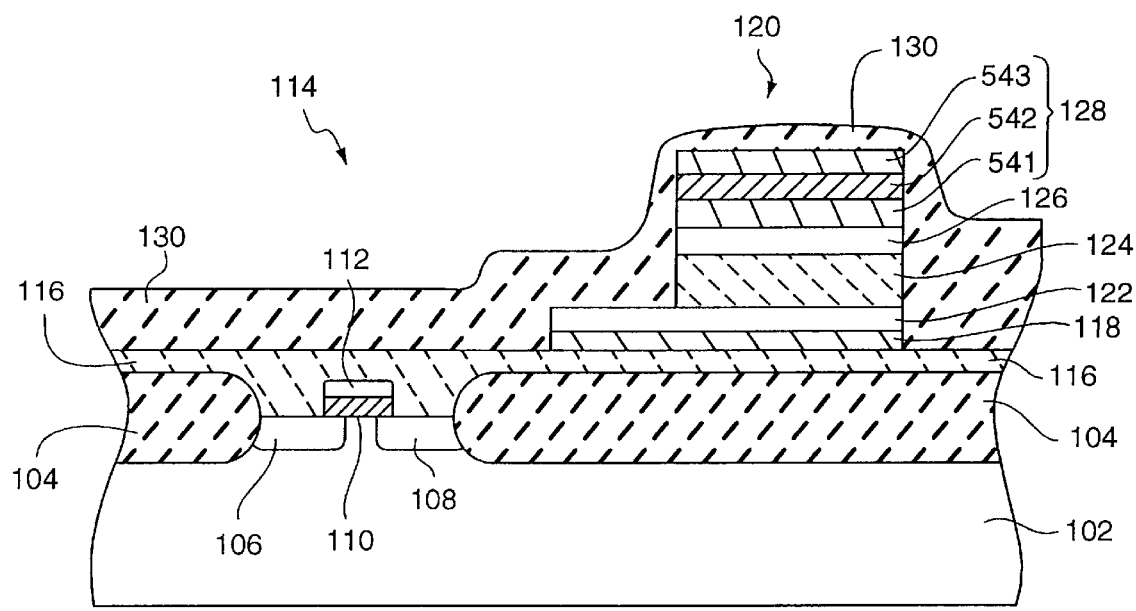
FIG. 5 depicts an alternative embodiment of the integrated circuit of FIG. 1 in which the hydrogen barrier layer comprises three distinct thin films.

In FIG. 1, the ferroelectric capacitor 120 contains a bottom electrode 122 made of platinum and having a thickness of 2000 Å, a ferroelectric thin film 124 formed on the bottom electrode 122, a top electrode 126 formed on the ferroelectric thin film 124, made of platinum and having a thickness of 2000 Å, and an electrically conductive hydrogen barrier layer 128 formed on the top electrode 126 and having a thickness of 500–2000 Å. The bottom and top electrodes of a capacitor conventionally contain platinum. It is preferable that the bottom electrode contain a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. The hydrogen barrier layer 128 can comprise a single film, for example, titanium nitride or silicon nitride, or it can contain two or more films, for example, a bottom film of titanium, then a film of titanium nitride followed by a titanium film. FIG. 5 depicts an alternative embodiment of the invention in which the self-aligned hydrogen barrier layer 128 comprises three distinct thin films, 541, 542, and 543, which preferably comprise a layer 541 of titanium, a layer 542 of titanium nitride, and a layer 543 of titanium. The term "self-aligned" means that they are formed in a process in which the barrier layer automatically aligns with the top electrode. For example, if both the top electrode 126 and the hydrogen barrier 128 are patterned together in the same photomask and etch patterning process, they will be self-aligned. The hydrogen barrier layer 128 can be deposited using a conventional sputtering technique. The composition of the ferroelectric thin film 124 is discussed in more detail below.

An second interlayer dielectric layer 130 made of NSG (nondoped silicate glass) is formed on ILD 116. A PSG (phospho-silicate glass) film or a BPSG film or a combination of all three can also be used in ILD 130.

Fabrication of the ferroelectric element, for example, the capacitor in FIG. 1, conventionally involves steps with oxidizing conditions that may damage the switch and other elements of the integrated circuit. After the ferroelectric element has been formed, a hydrogen heat treatment of the circuit is usually performed to repair oxidation damage of the switch 114. During this hydrogen treatment as well as during other high-energy steps, the ferroelectric properties of the ferroelectric thin film 124 are prone to degrade because hydrogen reacts with the oxides that the ferroelectric thin film 124 comprises. A significant portion of the destructive hydrogen diffuses vertically into the ferroelectric thin film through the top electrode if no hydrogen barrier layer is directly over the ferroelectric thin film.

In FIG. 2, a dry-etch process makes openings 216a through ILD 130 and ILD 116 to expose the source region 106 and gate region 108. The dry-etch process makes opening 231a through the ILD 130 and hydrogen barrier layer 128 down to the upper surface of top electrode 126. FIG. 2 depicts remnants of hydrogen barrier layer 128 in hole 231a. A dry-etch process also makes hole 230a through ILD 130 to expose a portion of bottom electrode 122.

In FIG. 3, a wet-etch process has removed the remnants of hydrogen barrier layer 128 from hole 231a and the upper surface of top electrode 126 so that circuit wiring, as shown in FIG. 4, can make good electrical contact.

In FIG. 4, source electrode wiring 432 and drain electrode wiring 434 are formed to fill openings 216a. Bottom electrode wiring 436 and top electrode wiring 438 are formed to fill the openings 230a and 231a, respectively. The drain electrode wiring 434 is electrically connected to bottom electrode wiring 436. Each of these wirings 432, 434 436 and 438 is made of Al—Si with a thickness of about 3000 Å.

The composition of the ferroelectric thin film 124 can be selected from a group of suitable ferroelectric materials, including but not limited to: an $ABO_3$-type metal-oxide perovskite, such as a titanate (e.g., $BaTiO_3$, $SrTiO_8PbTiO_3$ (PT), $PbZrTiO_3$ (PZT)), a niobate (e.g., $KNbO_3$), and, preferably, a layered superlattice compound.

$ABO_3$ type metal oxides are a well-known group of ferroelectric and high dielectric constant materials. See, for example, Franco Jona and G. Shirane, *Ferroelectric Crystals,* Dover Publications, N.Y., p. 108. U.S. Pat. No. 5,519,234 issued May 21, 1996, incorporated herein by reference, discloses that layered superlattice compounds, such as strontium bismuth tantalate, have excellent properties in ferroelectric applications as compared to the best prior materials and have high dielectric constants and low leakage currents. U.S. Pat. No. 5,434,102 issued Jul. 18, 1995 and U.S. Pat. No. 5,468,684 issued Nov. 21, 1995, incorporated herein by reference, describe processes for integrating these materials into practical integrated circuits.

The layered superlattice materials may be summarized generally under the formula: (1)

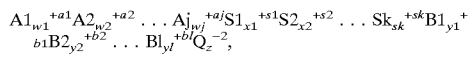

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements, and the subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $Sr_{0.75}Ba_{0.25}Bi_2Ta_2O_9$, on the average, 75% of the A-sites are occupied by a strontium atom and 25% of the A-sites are occupied by a barium atom. If there is only one A-site element in the compound then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=2z. \quad (2)$$

Formula (1) includes all three of the Smolenskii type compounds discussed in U.S. Pat. No. 5,519,234 issued May 21, 1996, which is hereby incorporated by reference as though fully incorporated herein. The layered superlattice materials do not include every material that can be fit into the formula (1), but only those which spontaneously form themselves into crystalline structures with distinct alternating layers.

The word "substrate" can mean the underlying wafer 102 on which the integrated circuit is formed, as well as any object on which a thin film layer is deposited, such as BPSG layer 116. In this disclosure "substrate" shall mean the object to which the layer of interest is applied; for example, when we are talking about a bottom electrode, such as 122, the substrate includes the layers 118 and 116 on which the electrode 122 is formed.

The terms "above", "upper", and "lower" herein with regard to direction in the integrated circuit 100 mean relative to the silicon substrate 102. That is if a second element is "above" a first element, it means it is farther from the substrate 102, and if it is "below" another element then it is closer to the substrate 102 than the other element. The long dimension of substrate 102 defines a plane that is considered to be a "horizontal" plane herein, and directions perpendicular to this plane are considered to be "vertical".

The term "thin film" is used herein as it is used in the integrated circuit art. Generally it means a film of less than a micron in thickness. The thin films disclosed herein are in all instances less than 0.5 microns in thickness. Preferably the ferroelectric thin films 124 are 1000 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The term "stoichiometric" herein, may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2TaNbO_9$ and $SrBi_2Ta_{1.44}Nb_{0.56}O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}Ta_{1.44}Nb_{0.56}O_9$, since it contains excess bismuth beyond what is needed to form a complete crystalline material. In this disclosure an "excess" amount of a metallic element means an amount greater than required to bond with the other metals present to make the desired material, with all atomic sites occupied and no amount of any metal left over. However, as known in the art, because bismuth oxide is highly volatile and significant heat is used in fabricating electronic devices according to the invention, the molar proportion of bismuth in a solid ferroelectric layer 124 made according to the process of the invention will generally be less than that in the stoichiometric formula for the precursor. However, the molar proportions of strontium, tantalum, and niobium in ferroelectric layer 124 made according to the process of the invention will be very close or identical to the molar proportions given in the stoichiometric formula for the precursor. See U.S. Pat. No. 5,434,102 issued to Watanabe et al.

Based on the Watanabe et al. U.S. Pat. No. 5,434,102 and related work, the precursor for making layered superlattice materials preferred by those skilled in the art presently has the stoichiometric formula $SrBi_{2.18}Ta_{1.44}Nb_{0.56}O_9$. It is believed that a precursor with this formula will result in a final solid strontium bismuth tantalum niobate thin film with the balanced stoichiometric formula $SrBi_2Ta_{1.44}Nb_{0.56}O_9$. That is, the final thin film does not contain excess bismuth because the excess bismuth in the precursor is carried away as bismuth oxide gas during the fabrication process. This precursor solution contains amounts of chemical precursors corresponding to the stoichiometric ratio $SrBi_{2.18}Ta_{1.44}Nb_{0.56}O_9$. This stoichiometric formula is referred to herein as the "standard" formula having the "standard" ratio of niobium to tantalum. A precursor having the standard stoichiometric formula includes about 9% excess bismuth. That is, the standard stoichiometric formula includes an amount of bismuth above what is required to bond with all the strontium, tantalum and niobium in the precursor to form a layered superlattice compound with all atomic sites in the crystal occupied. One feature of the invention is that a final layered superlattice compound with excess metal, that is amounts of at least one metal, such as bismuth and niobium, above or in addition to that shown in the standard formula is more resistant to degradation by hydrogen than material made with a precursor having the standard formula. A related feature is that excess amounts of a B-site element, such as niobium, in a layered superlattice material are effective in preventing the degradation of the electronic properties by exposure to hydrogen.

The term "free" as applied here to a chemical element, for example, "free titanium", means a form of the element in a chemically unreacted state, that is, in its elemental form, in contrast to being chemically bound in a chemical compound comprising more than one type of element.

Figure 6:
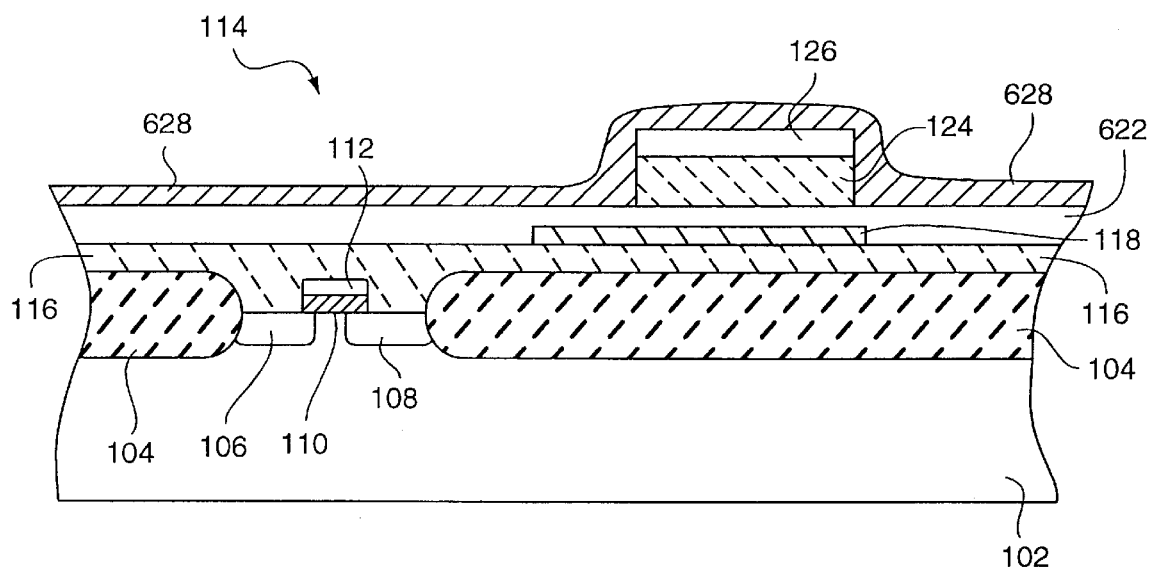
FIG. 6 is a cross-sectional view of an intermediate stage in the fabrication of an integrated circuit as may be performed by the method of the invention showing a nonvolatile ferroelectric memory cell in which a hydrogen barrier layer was formed on the bottom electrode layer and envelopes the ferroelectric thin film and the top electrode.

FIGS. 6–10 show intermediate stages in the fabrication of an integrated circuit using an alternative inventive process. As shown in FIG. 6, a bottom electrode layer 622 is formed on adhesion layer 118 and ILD 116. Then, ferroelectric thin film 124 and top electrode 126 are deposited, treated, and patterned. Hydrogen barrier thin film 628 is deposited on bottom electrode layer 622 to envelope ferroelectric thin film 124 and top electrode 126. The advantage of this alternative method is that the hydrogen barrier layer provides added protection to the ferroelectric thin film by inhibiting the diffusion of hydrogen into the ferroelectric thin film in a lateral direction from the sides of the capacitor.

Figure 7:
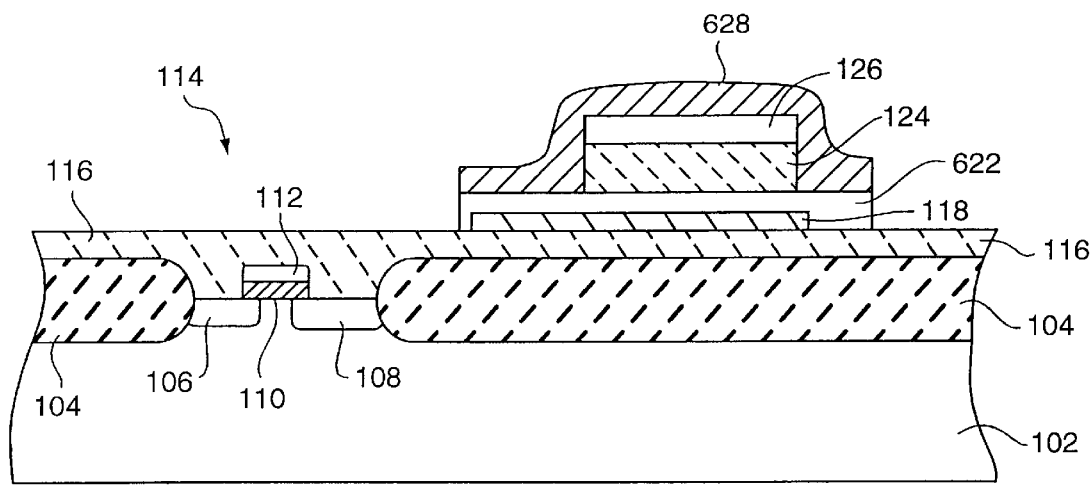
FIG. 7 is a cross-sectional view of a further intermediate stage in the fabrication of the integrated circuit depicted in FIG. 6 in which the bottom electrode layer and hydrogen barrier layer were etched away from above the MOSFET before hydrogen annealing.

As shown in FIG. 7, portions of hydrogen barrier thin film 628 and bottom electrode layer 622 are etched away from the area above MOSFET 114 so that hydrogen molecules can diffuse to the MOSFET region during hydrogen annealing.

As shown in FIG. 8, after hydrogen annealing and other high-energy steps producing hydrogenating and reducing conditions, a dry-etch process removes the hydrogen barrier layer 628 from capacitor 120, leaving remnants of the barrier layer on the surfaces of the capacitor 120. FIG. 9 depicts the circuit after a wet-etch process removed the remnants of hydrogen barrier layer 628 from capacitor 120 and after patterning of capacitor 120. FIG. 10 depicts the circuit with ILD 130, wiring holes 216a, 230a and 231a, and wiring layers 432, 434, 436 and 438.

Figure 11:
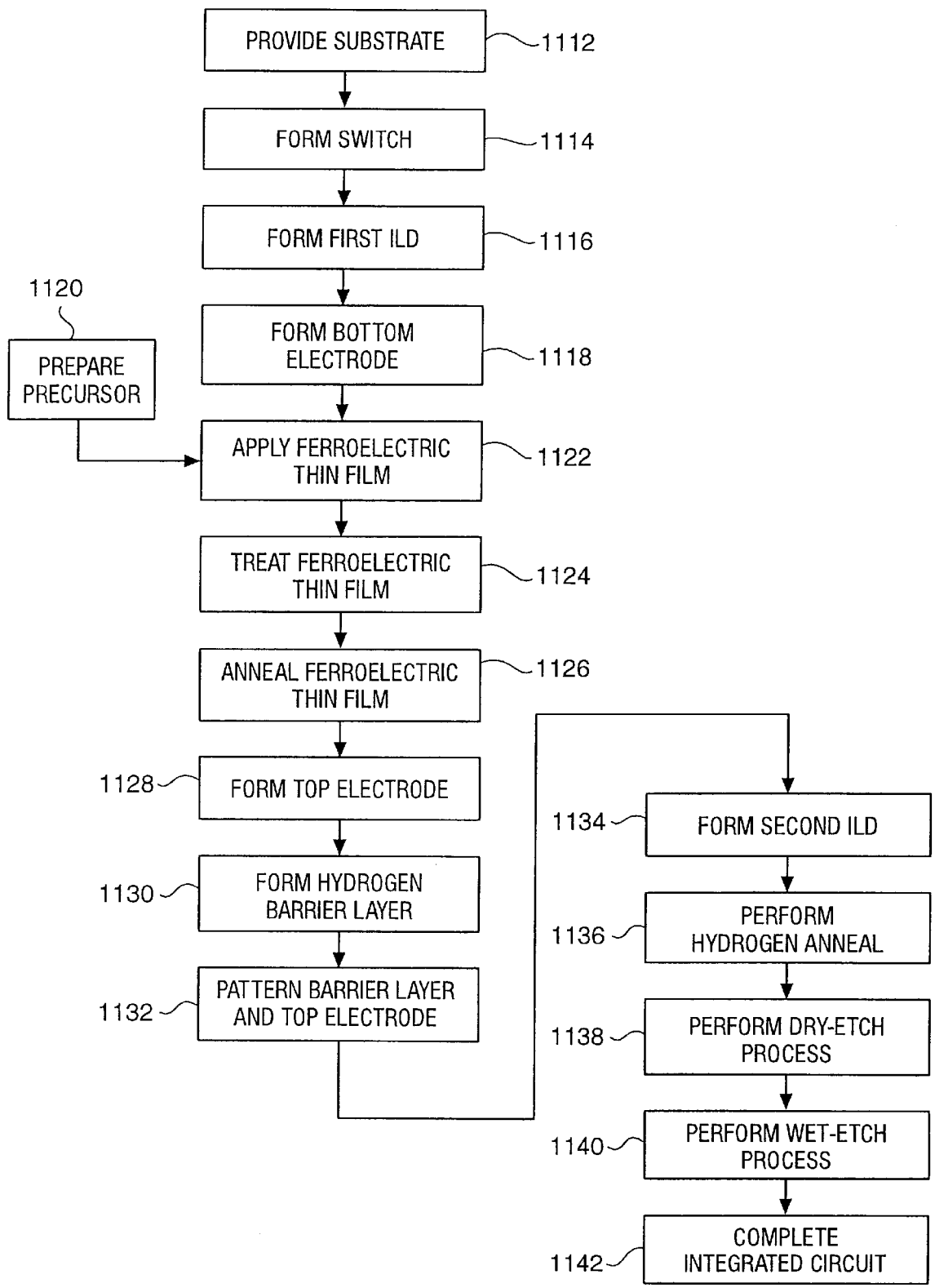
FIG. 11 is a flow chart showing a preferred embodiment of a process for fabricating a nonvolatile ferroelectric memory device according to the invention.

The diagram of FIG. 11 is a flow sheet of the fabrication steps used in this invention to make a ferroelectric memory 400. In step 1112, a semiconductor substrate 102 (FIG. 3) is provided on which a switch 114 is formed in step 1114. The switch is typically a MOSFET. In step 1116, an ILD 116 is formed to separate the switching element from the ferroelectric element to be formed. In step 1118, a bottom electrode 122 is formed. Preferably the electrode is made of platinum and is sputter-deposited to form a layer with a thickness of about 2000 Å. In the preferred method, an adhesion layer 118 made of titanium or titanium nitride of about 200 Å would be formed in this step, preferably by sputtering, prior to depositing the electrode. In step 1120, chemical precursors of the layered superlattice compounds that will form the desired ferroelectric thin film are prepared. The ferroelectric thin film 124 is applied to the bottom electrode in step 1122. In the preferred method, the ferroelectric thin film contains layered superlattice compounds. The ferroelectric thin films are preferably applied using a liquid deposition technique, such as spin-coating or a misted deposition method as described in U.S. Pat. No. 5,546,945. In the most preferred method, a spin-on technique is used to form the thin film. Usually, a final precursor solution is prepared from commercially available solutions containing the chemical precursor compounds. Preferably, the concentrations of the various precursors supplied in the commercial solutions are adjusted in step 1120 to accommodate particular manufacturing or operating conditions. For example, the stoichiometric amounts of the various elements in a typical commercial solution for a layered superlattice thin film might be $SrBi_{2.18}Ta_{1.44}Nb_{0.56}O_9$. It is often desirable, however, to add extra niobium or bismuth to this solution to generate extra oxides that will protect the ferroelectric compounds from hydrogen-annealing degradation. The application step 1122 is preferably followed by a treatment step 1124 which preferably includes a drying step and a crystallization substep at elevated temperatures such as a rapid thermal process; treatment step 1124 may include treatment with ultraviolet radiation during or after the application step 1122. Steps 1122 and 1124 may be repeated as necessary to form a film of the desired thickness. For example, in a typical spin-on procedure, a coat of the precursor might be applied and dried. Then another precursor coat might be applied and dried. The treated film is then annealed in oxygen to form the resulting ferroelectric thin film 124 in step 1126. Patterning steps via processes such as ion milling and ashing, as known in the art, are also included as appropriate in the fabrication of capacitor 120. For example, preferably, step 1118 includes such a patterning step, and another such patterning step follows step 1126. Following steps 1122–1126, the top electrode 126 is formed in step 1128. In the preferred method, a hydrogen barrier layer 128 is formed in step 1130 directly over the top electrode 126 of the capacitor and the ferroelectric thin film 124. Typically, the hydrogen barrier layer 128 is titanium nitride, which inhibits diffusion of hydrogen into the ferroelectric covered by it. It is also desirable to add a small amount of oxygen to the barrier layer by including a small amount of $O_2$-gas in the sputter atmosphere during sputter-deposition of the barrier layer. The resulting oxides that form in the barrier layer protect the ferroelectric compounds in the memory device by reacting with the hydrogen that can be present in various manufacturing process steps. Inevitably, some titanium is present in the titanium nitride. Alternatively, hydrogen barrier layer 128 can be formed by depositing a nitride of silicon. Some free silicon will typically be present in the layer. Barrier layer formation step 1130 is preferably followed by a patterning step 1132 in which the barrier layer 128 and the top electrode 126 are patterned, preferably in an ion milling process. A second ILD layer 130 is then deposited in step 1134. In step 1136, hydrogen annealing of the ferroelectric memory 400 is conducted at a temperature and annealing time chosen to satisfactorily eliminate the defects caused in the silicon substrate by oxidation and to minimize hydrogen degradation of the ferroelectric compounds. The hydrogen annealing step is preferably performed with $H_2$-gas in a gas mixture at atmospheric pressure because this is less complex than other alternatives, such as hydrogen-plasma annealing.

In step 1138, holes 216a, 230a, and 231a are made through the ILD layers 116 and 130 to the switch 114 (typically to the source and drain regions of a MOSFET), to the bottom electrode 122, and to the top electrode 126 through hydrogen barrier layer 128, respectively, by using one or several dry-etching methods. Alternatively, the second ILD layer 130 can be formed and holes to the switch can be made before the hydrogen annealing in order to facilitate transport of the hydrogen gas to the switch region of the circuit. Since step 1138 is a dry-etching step, preferably a standard RIE technique, remnants of the hydrogen barrier layer typically remain in hole 231a and on the surface of top electrode 126, potentially interfering with electrical contacts. In step 1140, wet-etching of hole 231a removes remnants of hydrogen barrier layer 128. Preferably the chemical etching solution in step 1140 comprises $NH_4OH$, $H_2O_2$, and $H_2O$. Preferably the relative volume ratio $NH_4OH:H_2O_2:H_2O$ in the chemical etching solution is approximately 1:3:1. The circuit is completed in the next steps 1142, which typically include deposition of a wiring layer and its patterning to form wirings 432, 434, 436, and 438, deposition of a passivation layer, and packaging.

According to an alternative application of the inventive method, as shown in FIGS. 6–10, the bottom electrode layer 622 is not patterned initially, and the hydrogen barrier thin film 628 is formed to envelope the top and sides of the capacitor. Before hydrogen annealing, FIG. 7, the bottom electrode layer 622 and the hydrogen barrier thin film 628 are removed from the area above the MOSFET. Following hydrogen annealing, dry-etching step 1138 and wet-etching step 1140 are performed. After patterning of the capacitor, second ILD 130 is deposited and the integrated circuit is completed in steps 1142.

A ferroelectric element typically comprises a relatively flat thin film of ferroelectric material. The terms "lateral" or "laterally" refer to the direction of the flat plane of the thin film. Referring to FIGS. 1–10, the lateral direction would be the horizontal direction.

This specification refers to a hydrogen barrier layer being formed directly over a thin film of ferroelectric material. By "directly over" is meant that the barrier layer is above at least a portion of the ferroelectric thin film in the vertical direction in FIGS. 1–10. The term does not mean that the barrier layer is in direct contact with the ferroelectric layer. The barrier layer may or may not contact the ferroelectric layer. As long as it is directly above a portion of the ferroelectric layer, it will protect that portion from hydrogen diffusion. It is clear, however, that ferroelectric elements can be fabricated with varying orientations relative to the horizontal and vertical. For example, if the ferroelectric thin film is in the vertical plane, then the word "lateral" would refer to the vertical direction, and "directly over" would refer to an orientation normal to the vertical plane of the thin film.

Experiments have shown that use of a hydrogen barrier layer comprising titanium nitride is effective in minimizing the degradation of desired ferroelectric properties by hydrogen annealing. The hydrogen barrier layer preferably comprises titanium, titanium nitride or a combination of the two. Silicon nitride can also be used. It is useful to add oxygen to the sputtering gas while forming the hydrogen barrier layer in order to form titanium oxide. Titanium oxide acts as a getter of hydrogen and, thereby, helps to protect further the ferroelectric thin film.

A key feature of this invention is the efficient removal of the hydrogen barrier layer after hydrogen annealing by performing a dry, ion etch followed by a wet, chemical etch. The dry etch removes most of the hydrogen barrier layer by rapid, controlled, anisotropic etching. The chemical etch removes the remnants of the hydrogen barrier layer by selectively etching the titanium nitride, titanium, and titanium oxide.

Another aspect of the invention is performing the wet etch preferably using a solution of $NH_4OH$, $H_2O_2$, and $H_2O$. Even if the hydrogen barrier layer nominally comprises only titanium nitride, not titanium, it had been found that there is always some free titanium present in the titanium nitride. The $H_2O_2$ oxidizes the free titanium to form titanium oxide. The titanium oxide weakens the titanium nitride structure so that $NH_4OH$ can more easily wash it away. Also, the $H_2O_2$ has a selectivity of approximately two to one (2:1) between titanium and layered superlattice compounds, so that it helps to dissolve and remove the hydrogen barrier layer without damaging the ferroelectric thin film when it comes in contact with it. As stated above, the inventive process can also be applied using a nitride of silicon to form the hydrogen barrier layer.

There has been described a method and structure for fabricating ferroelectric integrated circuits that permit exposure to hydrogen and still result in ferroelectric devices with good electrical properties; an important feature of the method and structure is forming a hydrogen barrier layer, and then fully and easily removing the barrier layer after exposure to hydrogen. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that the oxidation of an element of the barrier compound has been shown to be key to full removal of the barrier layer, this method can be combined with other processes to provide variations on the method described. It is also evident that the steps recited may in some instances be performed in a different order. Or equivalent structures and process may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A method for fabricating ferroelectric integrated circuits comprising the steps of:

providing a substrate;

forming on said substrate a thin film of a ferroelectric metal oxide material;

forming a hydrogen barrier layer directly over at least a portion of said thin film of metal oxide material;

performing a dry etch to remove a significant portion of said hydrogen barrier layer; and performing a wet, chemical etch to remove remnants of said hydrogen barrier layer, said etch being stopped on a material selected from the group consisting of conductors and a ferroelectric material.

2. A method according to claim 1 wherein said dry etch is an ion-mill etching process.

3. A method according to claim 1 wherein said wet etch comprises using a solution containing $NH_4OH$, $H_2O_2$, and $H_2O$.

4. A method according to claim 1 wherein said hydrogen barrier layer comprises a nitride of titanium.

5. A method according to claim 1 wherein said hydrogen barrier layer comprises titanium.

6. A method according to claim 1 wherein said hydrogen barrier layer comprises a nitride of silicon.

7. A method according to claim 1 wherein said metal oxide material comprises an oxide compound containing at least two metals.

8. A method according to claim 7 wherein at least one of said metals is present in said material in an excess amount.

9. A method according to claim 1 wherein said thin film of metal oxide material comprises a layered superlattice compound.

10. A method according to claim 9 wherein said layered superlattice compound comprises strontium, bismuth, and at least one of the metals from the group consisting of tantalum and niobium.

11. A method according to claim 10 wherein said layered superlattice compound contains an excess amount of at least one of the metals selected from the group consisting of bismuth and niobium.

12. A method according to claim 1 wherein said thin film of metal oxide material is part of a ferroelectric capacitor or part of a FET.

13. A method according to claim 1 further comprising the steps of:
    forming a bottom electrode over which said thin film of metal oxide material is formed; and
    forming a top electrode above said thin film of metal oxide material prior to forming said hydrogen barrier layer.

14. A method according to claim 13 further comprising the step of etching at least a portion of said hydrogen barrier layer to expose a portion of said top electrode.

15. A method for fabricating ferroelectric integrated circuits comprising the steps of:
    providing a substrate;
    forming on said substrate a thin film of metal oxide material;
    forming a hydrogen barrier layer directly over at least a portion of said thin film of metal oxide material, said hydrogen barrier layer comprising at least two chemical elements;
    performing a chemical reaction with at least one of said chemical elements; and
    removing substantially all of said hydrogen barrier layer from directly over said thin film of metal oxide material.

16. A method according to claim 15 wherein said chemical elements are titanium and nitrogen.

17. A method according to claim 15 wherein said chemical elements are silicon and nitrogen.

18. A method according to claim 15 wherein said chemical reaction is an oxidation reaction.

19. A method according to claim 18 wherein said oxidation reaction is performed using hydrogen peroxide.

20. A method for fabricating ferroelectric integrated circuits comprising the steps of:
    providing a substrate;
    forming on said substrate a thin film of metal oxide material;
    forming a hydrogen barrier layer directly over at least a portion of said thin film of metal oxide material, said hydrogen barrier layer comprising at least one free chemical element;
    performing a chemical reaction with said at least one free chemical element; and
    removing substantially all of said hydrogen barrier layer from directly over said thin film of metal oxide material.

21. A method according to claim 20 wherein said at least one free chemical element is titanium.

22. A method according to claim 20 wherein said at least one free chemical element is silicon.

23. A method according to claim 20 wherein said chemical reaction is an oxidation reaction.

24. A method according to claim 23 wherein said oxidation reaction is performed using hydrogen peroxide.

* * * * *